United States Patent
Ifis (10) Patent No.: US 11,051,403 B2
(45) Date of Patent: Jun. 29, 2021

(54) OVERHANG-COMPENSATING ANNULAR PLATING LAYER IN THROUGH HOLE OF COMPONENT CARRIER

(71) Applicant: AT&S Austria Technologie & Systemtechnik Aktiengesellschaft, Leoben (AT)

(72) Inventor: Abderrazzaq Ifis, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/775,517

(22) Filed: Jan. 29, 2020

(65) Prior Publication Data
US 2020/0253052 A1     Aug. 6, 2020

(30) Foreign Application Priority Data
Jan. 31, 2019   (CN) .......................... 201910101272.3

(51) Int. Cl.
*H05K 1/11*     (2006.01)
*H05K 3/42*     (2006.01)
*H05K 3/00*     (2006.01)

(52) U.S. Cl.
CPC .......... *H05K 1/115* (2013.01); *H05K 3/0038* (2013.01); *H05K 3/422* (2013.01); *H05K 3/425* (2013.01); *H05K 2201/09545* (2013.01); *H05K 2201/09827* (2013.01); *H05K 2203/107* (2013.01)

(58) Field of Classification Search
CPC ...... H05K 1/115; H05K 3/425; H05K 3/0038; H05K 3/422; H05K 2203/107; H05K 2201/09545; H05K 2201/09827

USPC ......................................................... 174/262
See application file for complete search history.

(56) References Cited

U.S. PATENT DOCUMENTS

| | | | |
|---|---|---|---|
| 2002/0011673 A1 | 1/2002 | Uzoh | |
| 2006/0270232 A1* | 11/2006 | Kawamura | B23K 26/382 438/690 |
| 2011/0209911 A1* | 9/2011 | Ishida | H05K 1/0222 174/264 |
| 2016/0242278 A1 | 8/2016 | Yoshida | |

(Continued)

FOREIGN PATENT DOCUMENTS

| | | |
|---|---|---|
| JP | H06177537 A | 6/1994 |
| JP | 2003046248 A | 2/2003 |

*Primary Examiner* — Sherman Ng
(74) *Attorney, Agent, or Firm* — Robert A. Blaha; Smith Tempel Blaha LLC (57) ABSTRACT

A component carrier with an electrically insulating layer having a front side and a back side, a first and a second electrically conductive layer covering the front side and the back side of the electrically insulating layer, respectively. A through hole extends through both electrically conductive layers and the electrically insulating layer. An overhang is formed along one of the electrically conductive layers and sidewalls of the electrically insulating layer structure delimiting the through hole. An annular plating layer covers the sidewalls and fills part of the overhang such that a horizontal extension of the overhang after plating is less than 20 μm and/or such that a ratio between a horizontal extension of the overhang after plating and a width of a first window through the first electrically conductive layer and/or a width of a second window through the second electrically conductive layer is smaller than 20%.

25 Claims, 3 Drawing Sheets

(56) References Cited

U.S. PATENT DOCUMENTS

2016/0249463 A1* 8/2016 Yoshida ................ H05K 3/423
2018/0139852 A1* 5/2018 Chamberlin ............ H05K 3/22

* cited by examiner

OVERHANG-COMPENSATING ANNULAR PLATING LAYER IN THROUGH HOLE OF COMPONENT CARRIER

CROSS-REFERENCE TO RELATED APPLICATION

This application claims priority to Chinese Patent Application No. 201910101272.3 filed on Jan. 31, 2019, the disclosure of which is hereby incorporated herein by reference.

TECHNICAL FIELD

Embodiments of the invention relate to a component carrier and a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to efficiently contact electrically conductive layer structures and/or components embedded in a component carrier with proper quality. Formation of mechanical vias and laser vias, which may be copper filled, may be advantageous for this and other purposes.

SUMMARY

There may be a need to manufacture a component carrier with proper electric reliability.

According to an exemplary embodiment of the invention, a component carrier is provided which comprises an electrically insulating layer structure having a front side and a back side, a first electrically conductive layer structure covering the front side of the electrically insulating layer structure, a second electrically conductive layer structure covering the back side of the electrically insulating layer structure, a through hole (in particular a laser through hole) extending through the first electrically conductive layer structure, the electrically insulating layer structure and the second electrically conductive layer structure, wherein an overhang is formed between at least one of the first electrically conductive layer structure and the second electrically conductive layer structure on the one hand and sidewalls of the electrically insulating layer structure delimiting the through hole on the other hand, and an annular plating layer covering the sidewalls and filling at least part of the overhang so that a horizontal extension of the overhang after plating is less than 20 µm and/or so that a ratio between, on the one hand, a horizontal extension of the overhang after plating and, on the other hand, a width of a first window extending through the first electrically conductive layer structure and/or a width of a second window extending through the second electrically conductive layer structure is smaller than 20%.

According to another exemplary embodiment of the invention, a meth-od of manufacturing a component carrier is provided, wherein the method comprises providing an electrically insulating layer structure having a front side and a back side, wherein a first electrically conductive layer structure covers the front side of the electrically insulating layer structure and a second electrically conductive layer structure covers the back side of the electrically insulating layer structure, forming a through hole (in particular a laser through hole) extending through the first electrically conductive layer structure, the electrically insulating layer structure and the second electrically conductive layer structure, wherein an overhang is formed between at least one of the first electrically conductive layer structure and the second electrically conductive layer structure on the one hand and sidewalls of the electrically insulating layer structure delimiting the through hole on the other hand, and forming an annular plating layer by plating to cover the sidewalls and to fill at least part of the overhang so that a horizontal extension of the overhang after plating is less than 20 µm and/or so that a ratio between, on the one hand, a horizontal extension of the overhang after plating and, on the other hand, a width of a first window extending through the first electrically conductive layer structure and/or a width of a second window extending through the second electrically conductive layer structure is smaller than 20%.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "through hole" may particularly denote a hole extending completely through the layer structures, and which may be formed in particular and preferably by laser processing. Thus, the through hole may be a laser through hole. Such a through hole may have, for example, two opposing tapering portions extending from the two opposing main surfaces of the electrically insulating layer structure. A through hole may be manufactured for instance by a combination of laser shots from the front side and the back side, i.e. from the two opposing main surfaces of, the electrically insulating layer structure. One or more laser shots may be performed from each of these sides. Formation of a through hole by laser processing from only one main surface may be possible as well. Furthermore, formation of a through hole may be carried out as well by other methods than laser processing, for instance by a plasma treatment.

In the context of the present application, the term "plating structure" may particularly denote a physical structure formed by plating, i.e. by a surface covering process in which a metal is deposited on a surface, in particular on an electrically conductive surface. In particular, a plating structure may be formed by electroplating. In electroplating, an ionic metal is supplied with electrons to form a non-ionic coating on an electrically conductive surface. A corresponding system may involve a chemical solution with the ionic form of the metal, an anode (i.e. a negatively charged electrode) which may correspond to the metal to be plated and a cathode (i.e. a positively charged electrode) where electrons are supplied to produce a film of non-ionic metal on the electrically conductive surface. For galvanic deposition or electroplating of a metal such as copper, water-based solutions may be used which contain the metal(s) to be deposited as ions (in particular dissolved metal salts). An electric field between an anode and a work-piece (such as the pre-form of the component carrier with the through hole (in particular laser through hole) having a sidewall to be covered with a plating structure) as cathode may force positively charged metal ions to move to the cathode where they give up their charge and deposit them-selves as metal on the surface of the sidewall of the through hole in the electrically insulating layer structure. Electroplating or galvanic deposition processes may encompass, besides the pure metal deposition, also preparative and/or post-treatments of the preform of the component carrier to be coated.

In the context of the present application, the term "annular plating layer" may particularly denote a plating layer with a shape of an annulus or a ring. An annular plating layer may therefore be circumferentially closed and may have a through hole extending vertically therethrough. The annular plating layer may be formed on the sidewalls of the electrically insulating layer structure defining the through hole, either directly or separated by a seed layer or the like. A vertically continuous region of the through hole may remain open after having formed to the annular plating layer.

In the context of the present application, the term "overhang" may particularly denote a mechanically non-supported partial length of a respective one of the electrically conductive layer structures directly adjacent to a respective window of the respective electrically conductive layer structure, which window is aligned with or forms part of the through hole. Over the mentioned partial length, the electrically conductive layer structure extends laterally beyond (or hangs freely in a cantilever fashion over) the electrically insulating layer structure. Thus, the overhanging material of the respective electrically conductive layer structure may be locally not supported by material of the electrically insulating layer structure along the extension of the overhang due to the presence of a portion of the through hole in a (for instance beak-shaped or funnel-shaped) pocket below the overhanging electrically conductive layer structure. What concerns the above statement that overhanging material may be locally not supported, it should be said that the overhang may relate to the substantially resin free area beneath the respective electrically conductive layer structure. However, a person skilled in the art will understand that some residue resin might be even present within a gap relating to the overhang. In order to quantitatively determine or measure the value of the overhang, the length of the substantially resin-free (wherein resin may refer to the electrically insulating layer structure) undercut directly under an overhanging electrically conductive layer structure may be measured (in particular even if it is not the most receding point or total relief below the overhanging electrically conductive layer structure, for example copper layer). In other words, for measuring the overhang, the undercut directly below the electrically conductive layer structure may be measured.

According to an exemplary embodiment of the invention, a method of forming and filling a through hole (in particular a laser through hole) in a component carrier is provided which allows to strongly suppress the risk of cracks in the electrically conductive filling of the through hole. Therefore, the manufactured component carrier can be operated with high electric reliability. In order to accomplish this, an electrically conductive filling of the through hole is created by a multistep procedure. The latter may involve a plating of sidewalls of an electrically insulating layer structure, delimiting the through hole, between two opposing electrically conductive layer structures before formation of a horizontal electrically conductive bridge structure connecting the sidewalls with one another. After having formed a through hole in a stack of the electrically insulating layer structure covered on both opposing main surfaces thereof with an electrically conductive layer structure, a significant overhang of electrically conductive material of the electrically conductive layer structures at one or more interfaces to the through hole may occur. Conventionally, such a pronounced overhang may result in the risk of cracks and voids in an electrically conductive filling in this region, which may deteriorate the electrical reliability of the component carrier. However, it has turned out that by plating sidewalls of the through hole by a separate annular plating layer so that the size of the overhang(s) is sufficiently reduced, crack formation can be significantly suppressed and electric reliability of the electrically conductive filling of the through hole may be improved. In particular, it has turned out that reducing the size of the overhang(s) to fall below 20 μm and/or to fall below 20% (in relation to a respective window in a respective electrically conductive layer structure) by the plating layer already significantly improves the performance and reliability of the component carrier. Thus, the overhang may be reduced by plating side walls so that the overhang gets reduced through or by the process. Particularly preferable is a reduction of the overhang by the formation of an extra or additional plating layer between the sidewalls and the bridge structure of, as an absolute value, not more than 14 μm and/or, as a relative value relating to the respective window diameter, not more than 14%.

According to an exemplary embodiment of the invention, a plated layer may be formed for compensating an excessive overhang by filling a respective portion of a through hole (in particular laser through hole) prior to a separate formation of a horizontal bridge structure. Thus, the risk of undesired cracks in a through hole filled with an electrically conductive medium due to an excessive overhang in particular in the presence of a thin electrically insulating layer structure (such as a thin core) with a high aspect ratio in the overhang area may be securely prevented. Experiments have shown that cracks may occur in particular when the overhang exceeds 14 μm or 14% of a respective window size, respectively. To ensure a high reliability of component carriers, the filling process of filling the through hole with electrically conductive filling medium may be adjusted to have a wider limit then their critical overhang limit. The mentioned annular plating layer is formed in the through hole according to an exemplary embodiment of the invention preceding formation of a bridge layer. The process of forming the plating layer may thus be specifically adapted or optimized to the task of sufficiently reducing the overhang. Preferably, but not necessarily, a thickness of the plating layer on the sidewall of the electrically insulating layer structure delimiting the through hole may be not larger than 14 μm. Thus, an exemplary embodiment of the invention introduces a processing sequence and structure for forming and filling through holes so as to obtain a sufficiently small and well-defined overhang range. An additional plating layer may serve as compensation layer with a sufficient thickness, in particular when the thickness of the electrically insulating layer structure (in particular core thickness) is low, in particular is below 60 μm. Even under such harsh conditions, through hole plating can be carried out with a wide processing window for obtaining a reliable component carrier. Hence, a method according to an exemplary embodiment of the invention can compensate failures of laser processing and ensure high reliability. A gist of an exemplary embodiment of the invention can be seen in the combination of overcoming an excessive overhang in through hole processing especially for avoiding a crack during bridge formation. This may be particularly appropriate when defined ranges of the overhang and core thickness are introduced. As a result, a highly reliable component carrier with plated through holes may be obtained offering specific advantages in the case of thin electrically insulating layer structures and a high density of plated through holes. Moreover, exemplary embodiments of the invention may allow to reach small features and increase the interconnection density.

In the following, further exemplary embodiments of the component carrier and the method will be explained.

In an embodiment, the component carrier is provided with a further plating structure which comprises a bridge structure horizontally connecting the sidewalls and which covers the plating layer up to the first electrically conductive layer structure and up to the second electrically conductive layer structure. Correspondingly, the method may comprise forming a further plating structure in a further plating procedure following the plating for forming the annular plating layer, wherein the further plating structure is formed with a substantially horizontal bridge structure connecting the sidewalls and covers the plating layer up to the first electrically conductive layer structure and up to the second electrically conductive layer structure. In the context of the present application, the term "bridge structure" may particularly denote an electrically conductive structure extending substantially horizontally between opposing sidewalls of the electrically insulating layer structure and delimiting the laser through hole, in particular at or close to a narrowest portion of the laser through hole. For instance, such a bridge structure can be formed by plating following laser through hole formation and following formation of the plating layer. The bridge structure may be delimited in an upward direction by a first demarcation surface and at a lower side by a second demarcation surface. Both the first demarcation surface and the second demarcation surface may have a concave shape. Thus, after having formed the compensating or plating layer, the manufacturing procedure can be continued with the formation of the bridge structure connecting the plating layer in particular at the narrowest portion of the laser through hole.

In an embodiment, the plating layer is formed as a layer being separate from the further plating structure which includes the bridge structure. In the context of the present application, the term "separately formed plating layer/structure" may particularly denote physically separate and visually distinguishable plating structures being formed in different plating procedures. As known by those skilled in the art, when separate plating procedures are carried out one after the other, an interface between the plating layer and the further plating structure is visible when inspecting a cross-sectional view of the component carrier. Different plating structures (such as the plating layer and the further plating structure) may be manufactured with different plating manufacturing equipment, with different plating chemistry, and/or in different periods of time. In other words, the plating layer on the one hand and the further plating structure (including the bridging structure) on the other hand may be physically separate and visually distinguishable layer structures formed in different, temporarily subsequent, manufacturing processes. Thus, the additional plating layer may be formed in particular after formation of a seed layer (in particular formed by electroless deposition) and before formation of the further plating structure to reduce the overhang to fall below a predetermined threshold value of for instance 20 μm, or preferably 14 μm, being selected sufficiently small for crack prevention.

In a preferred embodiment, the horizontal extension of the overhang after plating is less than 14 μm. According to such a highly preferred embodiment, the thickness of the plating layer is selected so that the value of the overhang falls below 14 μm by the additional formation of the plating layer. Experiments have shown that, when the overhang is below 14 μm, a highly reliable prevention of cracks in the filling of the laser through hole can be obtained.

In an embodiment, the horizontal extension of the overhang before plating is more than 20 μm, in particular is more than 14 μm. In particular, when the formation of the plating layer reduces the overhang from above 20 μm (or highly preferable from above 14 μm) to below 20 μm (or highly preferably below 14 μm), the improvement of the electrical reliability is particularly pronounced. In particular, the horizontal extension of the overhang in the presence of (or under consideration of) the plating layer may be less than 14 μm, whereas the horizontal extension of the overhang in the absence of (or without consideration of) the plating layer is more than 20 μm, in particular is more than 14 μm.

In an embodiment, a minimum thickness of the plating layer is at least 5 μm, in particular is at least 10 μm. Thus, the plating layer may be in particular significant thickly thicker than a seed layer. For instance, it is possible that the seed layer has a thickness above 1 μm and/or that several cumulative seed layers are provided. For example, a thickness of a seed layer or a cumulative thickness of a plurality of seed layers may be in a range between 0.5 μm and 5 μm. When multiple seed layers are provided, they may comprise an organic (for instance polymer) layer, a palladium layer, and/or a copper layer.

In an embodiment, a thickness of the electrically insulating layer structure in vertical direction is less than 180 μm, less than 120 μm, or less than 100 μm, in particular is in a range between 40 μm and 60 μm. While issues with cracks in the filling of the laser through hole are less pronounced with thick cores having a thickness of multiple hundreds of micrometers, cracks become more and more an issue with small core thicknesses. It has turned out that with such small core thicknesses, there is an increasingly high danger of electrical failure due to an incomplete filling of the laser through hole. Therefore, the concept of decreasing overhang by an additional plating layer provides particularly strong advantages when using thin electrically insulating layer structures.

Figure 7:
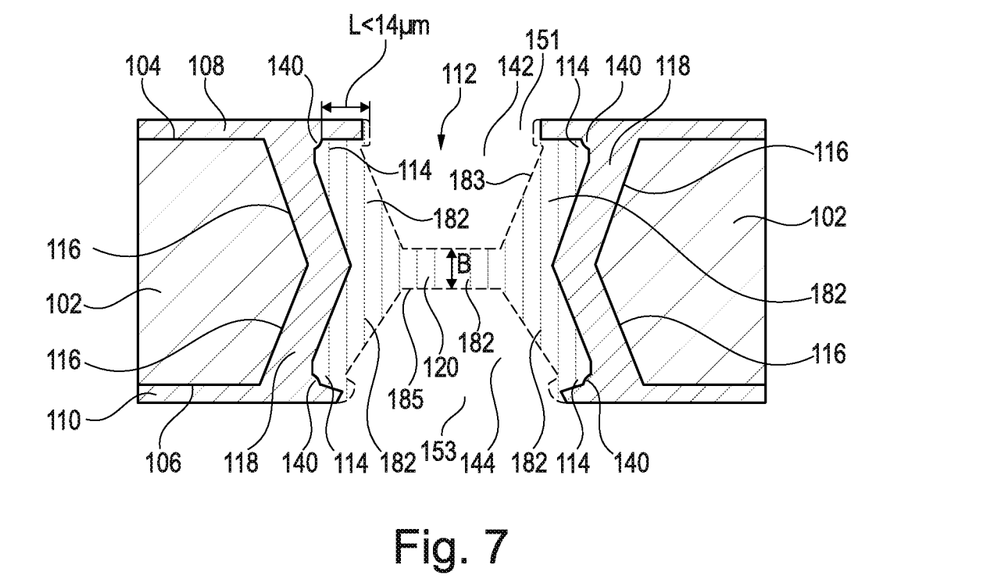

In an embodiment, the further plating structure is substantially H-shaped in a cross-sectional view (compare FIG. 7). The additional plating procedure for forming the further plating structure will not only connect sidewalls of the electrically insulating layer structures around a narrowest portion thereof by the bridge structure, but will also result in the formation of a thick sidewall coverage of the plating layer above and below the horizontal bridge structure. This results in a formation of a substantially H-shaped further plating structure, wherein the legs of the H may be slightly slanted depending on the tapering angle of the laser through hole.

Figure 5:
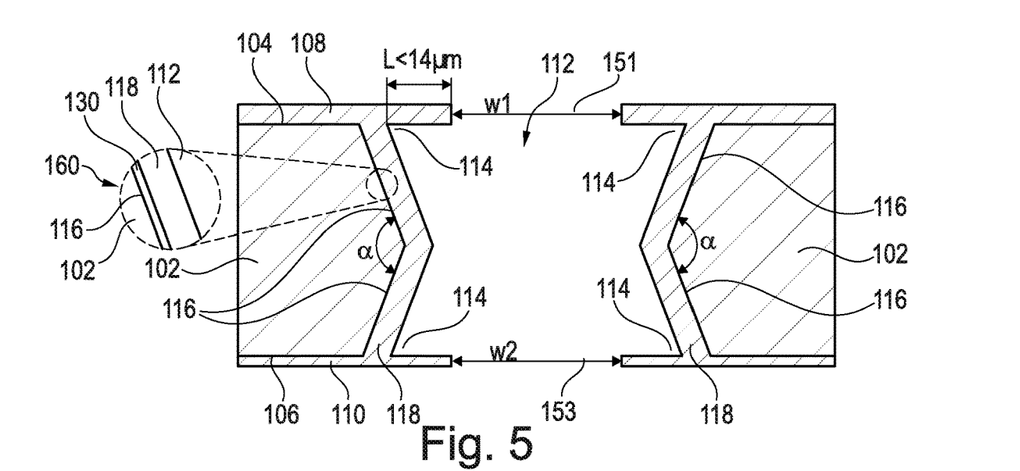
Figure 6:
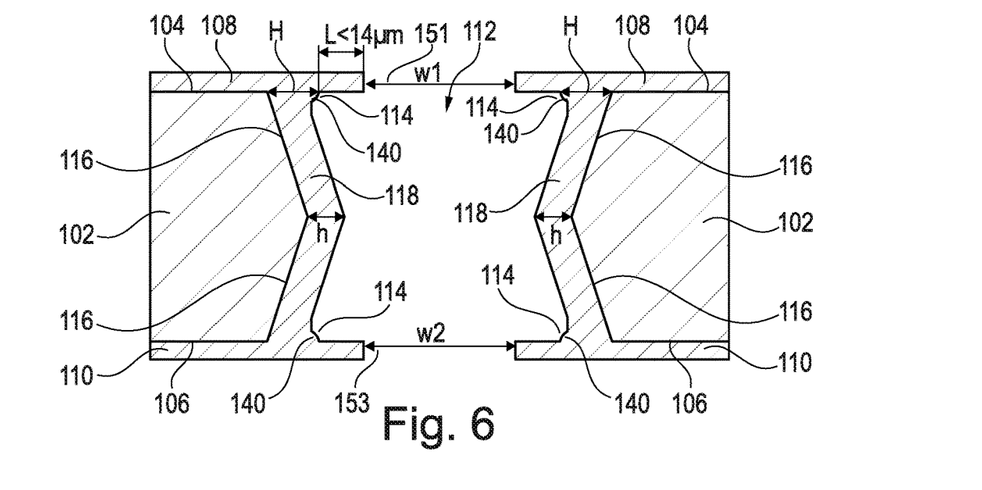

In an embodiment, the annular plating layer is shaped with two angled legs in a cross-sectional view (see FIG. 5 or FIG. 6). An angle between the two legs may be obtuse, i.e. larger than 90°.

In an embodiment, a thickness of at least one of the first electrically conductive layer structure and the second electrically conductive layer structure is less than 15 µm, in particular is less than 5 µm. With thick electrically conductive layer structures on both opposing main surfaces of the central electrically insulating layer structure, issues relating to poor reliability due to an overhang can be conventionally reduced by carrying out an etching procedure for overhang reduction. However, this concept fails at low values of the thickness of the electrically conductive layer structures, in particular when they are thinner than 15 µm or even 5 µm. With such dimensions, alternative concepts of overhang management become necessary, which is solved by embodiments of the present invention by the formation of the additional plating layer prior to the formation of the further plating structure.

In an embodiment, the component carrier comprises an electroless deposition layer or seed layer between the sidewalls and the plating layer. Correspondingly, the method may comprise forming an electrically conductive seed layer by electroless deposition between the sidewalls and the plating layer. In order to promote formation of the plating layer, the previous formation of a seed layer directly on the dielectric sidewalls of the electrically insulating layer structure exposed by the laser through hole is particularly advantageous. Such a thin layer may be formed advantageously by electro-less deposition or sputtering.

In an embodiment, the component carrier comprises at least one electrically conductive bulk structure made of electrically conductive filling material filling at least part of the laser through hole above and/or below the further plating structure or the bridge structure. After bridge formation, additional methods of depositing electrically conductive material such as copper may be carried out, in particular one or more additional separate plating procedures. By such additional material deposition procedures, electrically conductive material may be deposited on a concave surface on both opposing main surfaces of the bridge structure. Corresponding recesses above and/or below the further plating structure may be filled partially or entirely with electrically conductive material such as copper. By taking this measure, the electric reliability of the manufactured component carrier may be further increased.

In an embodiment, at least a part of the laser through hole is substantially X-shaped or substantially H-shaped. Correspondingly, the first laser drilling may comprise one laser shot and the second laser drilling may comprise only one laser shot. A laser through hole with a substantially X shape can be obtained by firstly forming a blind hole in the first main surface or front side of the electrically insulating layer structure by a first laser shot. This can be followed by a second laser shot from the back side of the electrically insulating layer structure to thereby extend the blind hole up to a through hole. The further plating structure with its bridge structure may then be formed, after formation of the additional plating layer, at the narrowest portion of the X-shaped laser through hole. However, the narrowest portion of the laser through hole can be rather asymmetrical, namely not in the middle of the through hole but rather more at the top or bottom side.

In another embodiment, at least a part of the laser through hole has a central substantially cylindrical section between two opposing tapering sections. Correspondingly, the first laser drilling may comprise one laser shot and the second laser drilling may comprise two laser shots. Such a structure may be obtained by adding a third laser shot from the back side after having carried out a first laser shot from the front side and a second laser shot from the back side. By such an additional third laser shot, the tapering characteristic of the laser through hole will become less pronounced and may be substituted partially by a cylindrical central section, which may further promote the formation of a properly filled laser through hole.

In yet another embodiment, at least a part of the laser through hole is straight-shaped. In particular, the entire laser through hole may be straight.

In a preferred embodiment, the plating is carried out so that a thick-ness of the plating layer at the overhang is larger than a thickness of the plating layer in a central portion of the laser through hole, i.e. that the plating layer has an inhomogeneous thickness along the vertical extension of the plating layer. According to such a highly preferred embodiment, the effect of the additional plating layer of reducing the overhang is particularly pronounced while preventing that the narrowest section of the laser through hole is excessively filled with electrically conductive material of the plating layer prior to bridge formation. Therefore, the selective thickening of the plating layer in the region(s) of the overhang(s) provides significant advantages.

In an embodiment, the plating layer may have at least one bump at the overhang. Such a bump may be a sudden rise or uneven area or an abrupt convexity or protuberance of the plating layer. This bump may at least partially fill the respective overhang for reducing the size of the latter. Thus, at least one bump may be arranged at an interface with at least one of the first electrically conductive layer structure and the second electrically conductive layer structure. Additionally or alternatively, a bump may be arranged in a narrowest region of the laser through hole. Providing more copper in the neck may make subsequent bridging easier.

In an embodiment, a rest of the plating layer apart from the at least one bump may have a substantially homogeneous thickness. Thus, the plating layer may be selectively broadened only in the region of the one or more overhangs to specifically reduce the overhang size. As a result, the manufactured component carrier has a very good electric reliability.

In an embodiment, the plating is carried out with a reverse current. When formation of the additional plating layer is carried out by galvanic deposition, the pre-form of the component carrier is placed in a bath in which electrically conductive material (in particular copper) is dissolved. By the application of a current to an electrically conductive surface of the pre-form of the component carrier, formation of the plating layer by galvanic deposition can then be triggered or promoted. It has turned out that when changing the current direction, i.e. when applying a reverse current, during the galvanic plating procedure, the thickness of the plating layer may become larger in the regions of the overhang(s) compared to a central region of the laser through hole (compare FIG. 6).

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as glass particles, in particular glass spheres).

In an embodiment, the at least one electrically insulating layer structure comprises at least one of the group consisting of resin (such as rein-forced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up material, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one of the electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component may be surface mounted on and/or embedded in the component carrier. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration.

In an embodiment, the component carrier is a laminate-type component carrier. In such an embodiment, the component carrier is a compound of multiple layer structures which are stacked and connected together by applying a pressing force and/or heat.

The substrate or interposer may consist of at least a layer of glass, silicon (Si) or a photo-imageable or dry-etchable organic material like epoxy-based build-up films or polymer compounds like polyimide, polybenzoxazole, or benzocyclobutene.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

The illustrations in the drawings are schematically presented. In different drawings, similar or identical elements are provided with the same reference signs.

Before referring to the drawings exemplary embodiments will be de-scribed in further detail, some basic considerations will be summarized based on which exemplary embodiments of the invention have been developed.

According to an exemplary embodiment of the invention, a compensation plating layer may be provided as part of an electrically conductive filling material filling at least part of a laser through hole for ensuring a safe and reliable laser through hole plating. In particular, such an additional plating layer may contribute to avoiding an overhang of excessive lateral length between an electrically insulating layer structure and electrically conductive layer structures of a stack of a component carrier according to an exemplary embodiment of the invention.

Processing laser through holes and filling them with electrically conductive material (such as copper) by plating is in particular a challenge when processing thin electrically insulating layer structures (such as thin cores), for instance having in particular a thickness of 100 µm or less. In such a scenario, challenges arise and among them the copper overhang is specifically severe. Indeed, having a high copper undercut in a thin electrically insulating layer structure (such as a 50 µm thick core) for example may lead to filling difficulties where cracks and inclusions may appear under the overhang area. It is believed that those cracks and inclusions are the result of the high aspect ratio in the overhang area in the described scenario. It has turned out difficult to adjust plating and filling parameters to overcome this issue.

It has been surprisingly found that a higher copper overhang than 14 µm may likely induce a copper plating with inclusions and cracks. When the copper overhang is larger than 20 µm, such inclusions and cracks may be induced highly likely. Therefore, reducing the overhang in particular in case of thin copper foils having a thickness of 5 µm or less on an in particular thin electrically insulating layer structure having a thickness of 100 µm or less, is particularly important, but cannot be etched away.

In order to overcome this shortcoming, an exemplary embodiment of the invention applies a compensation for the overhang area before bridging. In particular, to overcome the above limitations, a prior separate plating procedure before bridging can be setup in an advantageous way so that the plating layer covers a part of the overhang to reduce the risk of cracks and inclusions.

Figure 8:
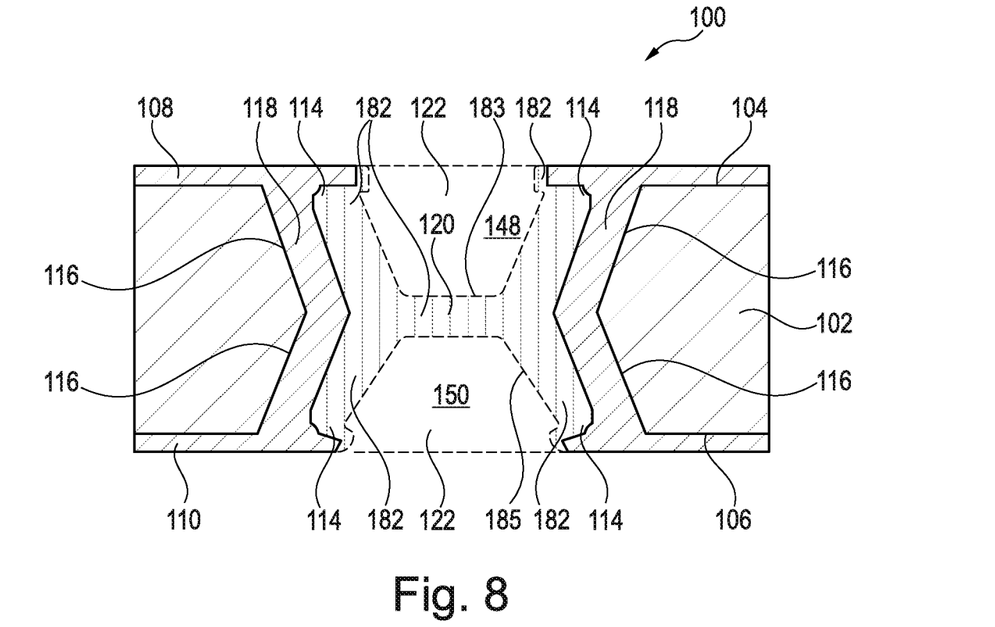

FIG. 1 to FIG. 8 illustrate cross-sectional views of structures obtained during carrying out a method of manufacturing a component carrier 100 according to an exemplary embodiment of the invention, shown in FIG. 8. This manufacturing procedure involves the formation of a laser through hole 112 by a multiple laser shot treatment from opposing sides (compare FIG. 1 to FIG. 4). Subsequently, such a laser through hole 112 may be filled partially or entirely with an electrically conductive filling material 122, such as copper, by carrying out multiple plating procedures according to an exemplary embodiment of the invention (compare FIG. 5 to FIG. 8).

Figure 1:
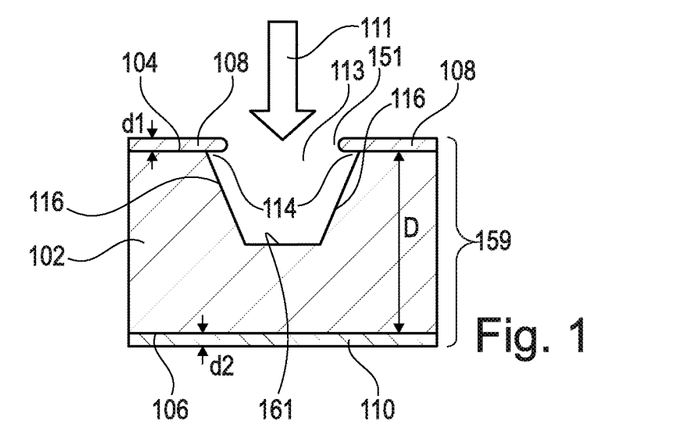
FIG. 1, FIG. 2 and FIG. 3 illustrate cross-sectional views of structures obtained during carrying out methods of manufacturing a component carrier with a laser through hole, shown in FIG. 2 and FIG. 3, by a multiple laser shot treatment from opposing sides according to an exemplary embodiment of the invention.

As shown in FIG. 1, starting point of the manufacturing method is a stack 159 comprising a first electrically conductive layer structure 108 on a first main surface or front side 104 of an electrically insulating layer structure 102. The stack 159 furthermore comprises a second electrically conductive layer structure 110 on a second main surface or back side 106 of the electrically insulating layer structure 102.

For example, the electrically insulating layer structure 102 may comprise resin (such as epoxy resin), optionally additionally comprising reinforcing particles such as glass fibers. For instance, the material of the electrically insulating layer structure 102 may be prepreg or FR4. The electrically conductive layer structures 108, 110 may be copper layers, in particular copper foils. For instance, a thickness D of the electrically insulating layer structure 102 may be below 60 µm, and a thickness d1, d2 of the electrically conductive layer structures 108, 110 may be each less than 5 µm.

In order to obtain the layer structure shown in FIG. 1, the front side 104 or first main surface of the electrically insulating layer structure 102 covered with the first electrically conductive layer structure 108 may be made subject of a first laser treatment. For this purpose, a first laser shot 111 can be carried out to form a through hole or window 151 in the first electrically conductive layer structure 108 and a blind hole 113 in the electrically insulating layer structure 102. For instance, a nominal value of the opening diameter of window 151 may be in a range between 70 µm and 85 µm, or even up to 100 µm. The blind hole 113 is delimited by sidewalls 116 and a bottom wall 161 of the electrically insulating layer structure 102.

Care should be taken that the laser energy and duration during the first shot 111 is not excessive so that the blind hole 113 does not reach up to the second electrically conductive layer structure 110. Otherwise, undesired effects such as a reflection of laser light, etc., may occur. Descriptively speaking, the blind hole 113 may later form a first tapering portion 126 of the laser through hole 112 shown in FIG. 2 or FIG. 3.

Figure 2:
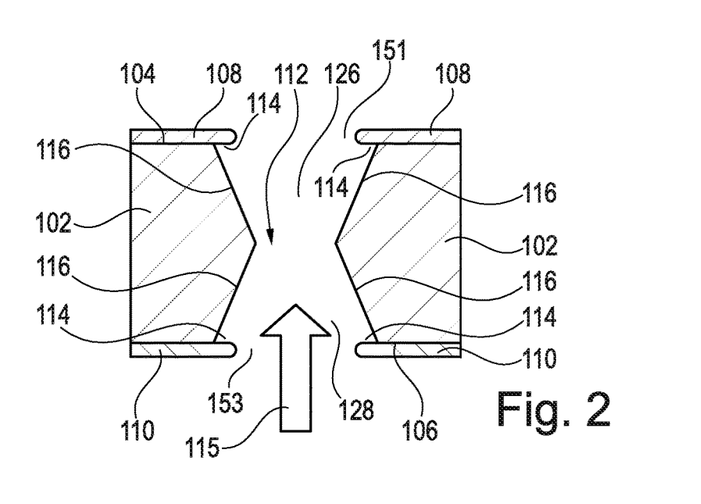

Referring to FIG. 2, formation of the laser through hole 112 may be completed by carrying out, after the first laser drilling from the first main surface or front side 104 with one laser shot according to FIG. 1, a second laser drilling from the second main surface or back side 106 with one laser shot. As a result of this back side laser drilling, a through hole or window 153 is formed in the second electrically conductive layer structure 110, and the blind hole 113 is extended until it forms laser through hole 112 extending between first main surface or front side 104 and second main surface or back side 106 of the electrically insulating layer structure 102. For instance, a nominal value of the opening diameter of window 153 may be in a range between 70 µm and 85 µm, or even up to 100 µm. As shown in FIG. 2, the laser through hole 112 has first tapering portion 126 extending from the first main surface or front side 104 and has second tapering portion 128 extending from the second main surface or back side 106. The first tapering portion 126 and the second tapering portion 128 meet each at a narrowest portion in the center of the laser through hole 112.

In order to obtain the structure shown in FIG. 2, the structure obtained after carrying out the procedure described referring to FIG. 1 may be made subject to a second laser shot 115 from the back side 106 or second main surface of the electrically insulating layer structure 102. After formation of the blind hole 113 according to FIG. 1, the pre-form of the component carrier 100 shown in FIG. 1 may be flipped in order to prepare the stack 159 for the subsequent second laser shot from the back side 104. As a result, a through hole is formed through the second electrically conductive layer structure 110 and additional material of the electrically insulating layer structure 102 is removed by the laser energy until the previously formed blind hole 113 is extended from the bottom side into laser through hole 112. This laser through hole 112 according to FIG. 2 has a substantial X shape and can be directly subsequently made subject to a procedure of being filled with electrically conductive filling medium such as copper (see FIG. 4 to FIG. 8). Formation of the laser through hole 112 according to FIG. 2 is simple and highly efficient and is therefore particularly appropriate for processing on industrial scale, since it may be sufficient to use only two laser shots for its formation.

Alternatively, it is possible to carry out a further laser drilling procedure from the back side 106 before filling the laser through hole 112 with electrically conductive filling medium such as copper. The latter mentioned embodiment will now be described referring to FIG. 3.

Figure 3:
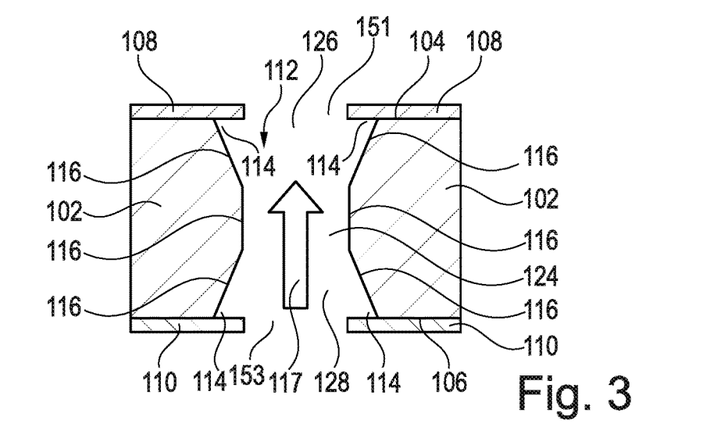

Referring to FIG. 3, the shape of the laser through hole 112 is modified in particular in the central portion thereof by carrying out, after the first laser drilling from the first main surface or front side 104 with one laser shot according to FIG. 1 and after carrying out the second laser drilling from the second main surface or back side 106 according to FIG. 2, a third laser shot from the back side 106.

Hence, alternatively to the procedure described referring to FIG. 2, it is also possible to carry out an additional third laser shot 117 from the back side 106 or second main surface of the electrically insulating layer structure 102 to refine the shape of the laser through hole 112. Such a third laser shot 117 may remove material in the central portion of the electrically insulating layer structure 102 so as to form a substantially cylindrical central portion 124 vertically between the two tapering portions 126, 128. Although the manufacturing procedure for forming the laser through hole 112 with the shape according to FIG. 3 requires an additional third laser shot 117 compared to FIG. 2, this shape may further improve the reliability of the manufactured component carrier 100.

Thus, it is optionally possible to carry out a third laser shot 117 from the back side 106, as shown in FIG. 3. With such an additional third laser shot 117, it is possible to remove further material of the electrically insulating layer structure 102 in a central portion thereof where the laser through hole 112 of FIG. 2 has its narrowest portion.

In yet another embodiment, two shots from the top side can be made (in particular in combination with a single shot, two shots or more than two shots from the bottom side).

A laser through hole filling procedure according to an exemplary embodiment of the invention will be described in the following referring to FIG. 4 to FIG. 8 and is based on a geometry of the laser through hole 108 of the type as shown in FIG. 2. A skilled person will understand that it is alternatively also possible according to another exemplary embodiment of the invention to initiate filling of the laser through hole 112 based on a geometry as shown in FIG. 3.

Figure 4:
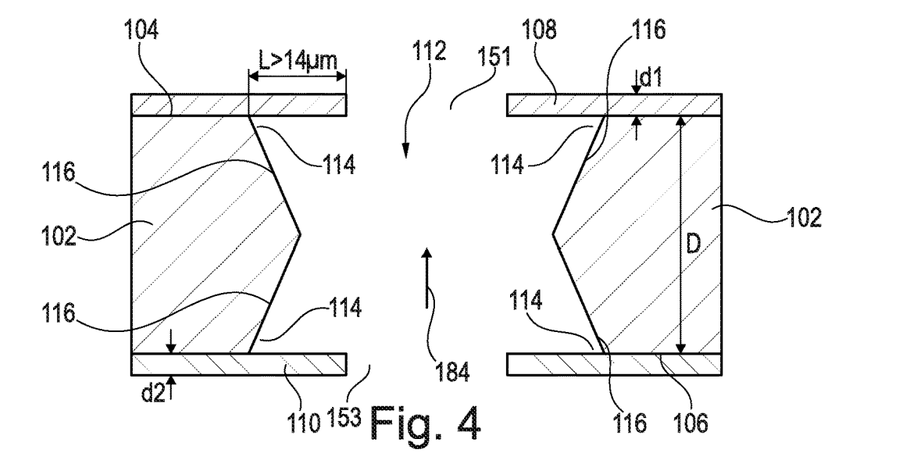
FIG. 4, FIG. 5, FIG. 6, FIG. 7 and FIG. 8 illustrate cross-sectional views of structures obtained during carrying out a method of manufacturing a component carrier with a laser through hole being filled with an electrically conductive filling medium according to an exemplary embodiment of the invention.

As can be taken from FIG. 2 to FIG. 4, both on the front side 104 as well as on the back side 106, an overhang 114 may be formed as hollow pocket between the electrically insulating layer structure 102 and a respective one of the electrically conductive layer structures 108, 110. The overhangs 114 are illustrated in FIG. 4 in more detail, wherein FIG. 4 corresponds to the configuration according to FIG. 2. The subsequently described manufacturing procedure will be explained based on this geometry. A person skilled in the art will understand that a corresponding manufacturing process can be carried out in a corresponding way starting from the geometry according to FIG. 3.

As shown in FIG. 4, the value or size L of the overhang 114 in a lateral direction is L>14 µm after formation of the laser through hole 112 and before filling it with electrically conductive material. If bridge formation (compare FIG. 7) would be started from the structure shown in FIG. 4, it may, in view of the small vertical thickness d1, d2 of the electrically conductive layer structures 108, 110 and in view of the small vertical thickness D of the electrically insulating layer structure 102, likely result in the formation of cracks after having filled the laser through hole 112 with electrically conductive material. With the procedure described in the following referring to FIG. 5 and FIG. 6, undesired cracks and inclusions in the overhangs 114 may be prevented and the reliability of the obtained component carrier 100 shown in FIG. 7 may be high.

Referring to FIG. 5, formation of a compensation layer by plating for compensating the excessive overhang 114 can be carried out.

As shown in a detail 160, a thin seed layer 130 (in particular made of copper) is firstly formed directly on the dielectric sidewalls 116 of the electrically insulating layer structure 102, for instance by electroless deposition. Subsequently, a first electroplating procedure may be carried out to thereby form an annular plating layer 118 on the seed layer 130 on the sidewalls 116 of the electrically insulating layer structure 102. Thus, the annular plating layer 118 (which may also be denoted as electroplating layer) is formed on the seed layer 130 and may be made as well of copper. The annular plating layer 118 is formed as a circumferential structure on the sidewall 116 and maintains a (spatially limited) portion of the laser through hole 112 extending through the annular plating layer 118. For instance, the first electroplating procedure may be a galvanic plating procedure.

Descriptively speaking, the structure shown in FIG. 5 is obtained by firstly carrying out an electroless deposition procedure for forming the seed layer 130 of chemical copper. A thickness of the seed layer 130 may be for instance 1 µm. The chemical copper of the seed layer 130 may be formed by a chemical reaction to obtain an electrically conductive surface on the sidewalls 116 for promoting subsequent formation of the plating layer 118. Optionally, the procedure of forming the seed layer 130 may be carried out after a previous desmearing procedure during which the laser through hole 112 may be cleaned and the resin thereof may be swelled to obtain an improved surface roughness. Such a procedure may further improve the reliability of the manufactured copper filled laser via.

After having formed the seed layer 130, the mentioned first galvanic plating or electroplating procedure may be carried out for forming the plating layer 118. For this purpose, a current may be applied to the electrically conductive seed layer 130. The pre-form of the component carrier 100 shown in FIG. 5 may be, during this galvanic plating procedure, immersed in a bath with a copper source. Due to the electric current applied between cathode and anode, metallic copper will deposit on the seed layer 130, thereby forming the plating layer 118.

The plating layer 118 shown in FIG. 5 covers the seed layer 130 on the sidewalls 116 with substantially homogeneous thickness. A value of the horizontal thickness of the plating layer 118 may be for example 10 µm. In the cross-sectional view of FIG. 5, i.e. in accordance with a viewing plane comprising main extension direction 184 of the laser through hole 112, the plating layer 118 is shaped as two angled legs on the left-hand side and on the right-hand side, wherein an angle α between the legs is here obtuse.

As shown in FIG. 5, the annular plating layer 118 is formed by electroplating to cover the entire sidewalls 116 and to fill part of the overhang 114 so that the horizontal extension or size L of the overhang 114 after plating is less than 14 µm. This ensures the robustness of the component carrier 100 against cracks and inclusions or voids. Additionally or alternatively, it is advantageous for reducing the risk of crack or void formation that a ratio between, on the one hand, the horizontal extension L of the overhang 114 after plating and, on the other hand, a width w1 of the first window 151 extending through the first electrically conductive layer structure 108 is preferably smaller than 14%. Further additionally or alternatively, it is advantageous for reducing the risk of crack formation that a ratio between, on the one hand, the horizontal extension L of the overhang 114 after plating and, on the other hand, a width w2 of the second window 153 extending through the second electrically conductive layer structure 110 is preferably smaller than 14%.

Referring to FIG. 6, it is shown what happens when the plating procedure for forming the plating layer 118 is continued. This plating procedure can be carried out preferably without impact on the via opening. For instance, reverse plating can be carried out for this purpose, i.e. a galvanic plating procedure during which the polarity of the current is alternatingly changed, for instance in a periodic fashion. As can be taken from FIG. 6, this plating procedure for forming the plating layer 118 results in a geometry in which a thickness H of the plating layer 118 at the overhang(s) 114 is larger than a thickness h of the plating layer 118 in a central portion of the laser through hole 112. More specifically, the plating layer 118 may be formed with bumps 140 at the position of the overhang(s) 114 between the electrically insulating layer structure 102 on the one hand and each of the electrically conductive layer structures 108, 110 on the other hand. In contrast to its locally thickened portions or bumps 140 at the overhangs 114, the plating layer 118 has a substantially homogeneous thickness h in the central portion of the laser through hole 112.

Thus, the shape according to FIG. 6 relates to a plating layer 118 that covers the internal via wall/sidewall 116 without a big impact on the copper opening diameter. Indeed, if the opening is plated with thick conductive material, the overhang 114 will not be reduced and the filling process will get more difficult with high reliability risks. To plate internally without impact on the copper opening, the reverse current operation mode can be used for example to allow more plating on the via wall than the opening. By changing the direction of the electric current applied to electrodes of a galvanic deposition bath in which the pre-form of the component carrier 100 shown in FIG. 5 and FIG. 6 is immersed, the homogeneously thick (thickness h) plating layer 118 is formed on the sidewalls 116 (or more precisely on seed layer 130) with the exception of the region of the over-hang(s) 114, where the thickness H of the plating layer 118 is locally increased (see bumps 140). By taking this measure, the reduction of the overhang 114 is particularly pronounced while ensuring that the narrowest portion of the laser through hole 112 is not yet closed by the plating layer 112. This can be accomplished by reversing the current applied to the galvanic electrodes during formation of the plating layer 118.

Referring to FIG. 7, bridging is carried out in a separate further plating procedure following formation of the plating layer 108. The thickness(es) H, h of the compensation layer or plating layer 118 may depend on the level of the overhang 114 following the principle that the remaining overhang 114 before bridging should be smaller than 20 µm and is preferably even lower than 14 µm. After the compensation layer plating layer 118 has been set up, the bridging and filling process can follow up, as shown in FIG. 7.

Hence, a separate second electroplating procedure may be subsequently carried out (i.e. after the first electroplating procedure for forming and broadening the plating layer 118) to thereby form a further plating structure 182 (which may also be denoted as further electroplating structure) on the plating layer 118. As shown, the further plating structure 182 is formed to comprise an electrically conductive bridge structure 120 connecting the opposing sidewalls 116 and closing the through hole remaining after forming the annular plating layer 118. In other words, the bridge structure 120 forms an integral part of the further plating structure 182, together with slanted legs of the further plating structure 182 being integrally connected with the bridge structure 120. The slanted legs of the further plating structure 182 are formed on the slanted legs of the plating layer 118. More specifically, the further plating structure 182 is substantially H-shaped and covers lateral sidewalls of the plating layer 118 and forms the substantially horizontal bridge structure 120. A minimum thickness B of the bridge structure 120 may be at least 20 µm or preferably 25 µm or more. In the cross-sectional view of FIG. 7, the further plating structure 182 is substantially H-shaped. Thus, after having obtained the structure shown in FIG. 6, a separate further plating procedure of the same or different kind may be carried out, for instance galvanic plating. By taking this measure, the further plating structure 182 is obtained. It has turned out that by adding the separate procedure of forming the plating layer 118 prior to the formation of the further plating structure 182 including bridge structure 120, the reliability of the obtained component carrier 100 can be improved.

Thanks to the additional plating layer 118 and in particular in view of the local thickness increase of the plating layer 118 in the region of the bumps 140, the reduced size L<14 µm of the overhang 114 results in a strong suppression of the tendency of crack formation in the region of the overhang 114. As can be taken from FIG. 7, the further plating structure 182 will first close a gap in the narrowest section of the through hole 112 by forming the bridge structure 120 and will also cover exposed sidewalls of the plating layer 118.

The geometry of the through hole 112 may result, when carrying out a plating process, in the formation of the bridge structure 120 laterally connecting opposing sidewalls 116 of the electrically insulating layer structure 102 delimiting the through hole 112 at a vertical level at which the distance to the first main surface or front side 104 is different from the distance to the second main surface or back side 106. This may promote the formation of a free hanging, asymmetrical bridge structure 120 located out of a vertical center of the through hole 112.

Referring to FIG. 8, the procedure of filling the laser through 112 with electrically conductive filling medium 122 is then completed to thereby obtain component carrier 100 according to an exemplary embodiment of the invention. The aspect ratio obtained is convenient for complete bridging and filling.

As shown in FIG. 8, the method comprises forming a first electrically conductive bulk structure 148 filling a recess above the bridge structure 120. Moreover, the method comprises forming a second electrically conductive bulk structure 150 filling a recess below the bridge structure 120. The first electrically conductive bulk structure 148 and the second electrically conductive bulk structure 150 may be formed by a further electroplating procedure (in particular a further galvanic plating procedure) following the electroplating procedure of forming the bridge structure 120. As shown in FIG. 7 and FIG. 8, the electrically conductive bridge structure 120 is formed to be delimited by an upper first demarcation surface 183 oriented upwardly or facing towards the first main surface or front side 104 and by a lower second demarcation surface 185 orientated downwardly or facing towards the second main surface or back side 106.

Although not shown in FIG. 8, a small dip may remain at an upper side and/or a lower side of the shown component carrier 100. In other embodiments, the bulk structures 148, 150 fill the remaining recesses above the first demarcation surface 183 and below the second demarcation surface 185 almost completely. A skilled person will understand that the bulk structures 148, 150 are clearly distinguishable from the further plating structure 182 at the demarcation surfaces 183, 185 and that the further plating structure 182 is clearly distinguishable from the plating layer 118 in a cross-section of the component carrier 100.

With yet another single or multiple plating procedure, for instance by carrying out further galvanic plating procedures/electrodeposition procedures, the remaining recesses above the first demarcation surface 183 and below the second demarcation surface 185 may be partially or entirely filled.

In a nutshell, the electrically conductive filling medium 122 may be composed of the seed layer 130 as electroless layer, the plating layer 118 as compensation layer, the further plating structure 182 including the bridging layer structure 120, and the electrically conductive bulk structures 148, 150 as filling structure for filling volumes above and below the demarcation surfaces 183, 185. With such a filling architecture, there is no risk of the formation of any crack or inclusion during the filling of the laser through hole 112, in particular not in the area of the overhang 114. As a result, a highly reliable component carrier 100 can be obtained.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   an electrically insulating layer structure having a front side and a back side;
   a first electrically conductive layer structure covering the front side of the electrically insulating layer structure;
   a second electrically conductive layer structure covering the back side of the electrically insulating layer structure;
   a through hole extending through the first electrically conductive layer structure, the electrically insulating layer structure and the second electrically conductive layer structure, wherein an overhang is formed between at least one of the first electrically conductive layer structure and the second electrically conductive layer structure and sidewalls of the electrically insulating layer structure delimiting the through hole; and
   an annular plating layer covering the sidewalls and filling at least part of the overhang so that a horizontal extension of the overhang after plating is less than 14 µm so that a ratio between a horizontal extension of the overhang after plating and a width of a first window extending through the first electrically conductive layer structure and a width of a second window extending through the second electrically conductive layer structure is smaller than 14%;
   wherein the horizontal extension of the overhang in the absence of plating layer is more than 20 µm.

2. The component carrier according to claim 1, further comprising:
   a further plating structure which comprises a bridge structure horizontally connecting the sidewalls and which covers the plating layer up to the first electrically conductive layer structure and up to the second electrically conductive layer structure.

3. The component carrier according to claim 2, wherein the plating layer and the further plating structure are configured as separate structures.

4. The component carrier according to claim 1, wherein a minimum horizontal thickness of the plating layer is at least 5 µm.

5. The component carrier according to claim 1, wherein a vertical thickness of the electrically insulating layer structure is less than 200 µm.

6. The component carrier according to claim 2, wherein the further plating structure is substantially H-shaped in a cross-sectional view.

7. The component carrier according to claim 1, wherein the annular plating layer is shaped as two angled legs in a cross-sectional view.

8. The component carrier according to claim 1, wherein a thickness of at least one of the first electrically conductive layer structure and the second electrically conductive layer structure is less than 15 µm.

9. The component carrier according to claim 1, further comprising:
   a seed layer between the sidewalls and the plating layer.

10. The component carrier according to claim 2, further comprising:
    at least one electrically conductive bulk structure filling at least part of the through hole above and/or below the further plating structure.

11. The component carrier according to claim 1, wherein at least a part of the through hole is substantially X-shaped.

12. The component carrier according to claim 1, wherein at least a part of the through hole has a central substantially cylindrical section between two opposing tapering sections.

13. The component carrier according to claim 1, wherein at least a part of the through hole is straight-shaped.

14. The component carrier according to claim 1, wherein a thickness of the plating layer at the overhang is larger than a thickness of the plating layer in a central portion of the through hole.

15. The component carrier according to claim 1, wherein the plating layer has at least one bump, in particular arranged at an interface with at least one of the first electrically conductive layer structure and the second electrically conductive layer structure and/or arranged in a narrowest region of the through hole, which locally thickens the plating layer at the overhang.

16. The component carrier according to claim 15, wherein a rest of the plating layer apart from the at least one bump has a substantially homogeneous thickness.

17. The component carrier according to claim 1, comprising at least one of the following features:
the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures comprises at least one of a group consisting of copper, aluminum, nickel, silver, gold, palladium, and tungsten;
wherein the electrically insulating layer structure comprises at least one of a group consisting of resin, in particular reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carrier is shaped as a plate;
wherein the component carrier is configured as one of a group consisting of a printed circuit board, and a substrate;
wherein the component carrier is configured as a laminate-type component carrier.

18. A method of manufacturing a component carrier, comprising:
providing an electrically insulating layer structure having a front side and a back side, wherein a first electrically conductive layer structure covers the front side of the electrically insulating layer structure and a second electrically conductive layer structure covers the back side of the electrically insulating layer structure;
forming a through hole, extending through the first electrically conductive layer structure, the electrically insulating layer structure and the second electrically conductive layer structure, wherein an overhang is formed between at least one of the first electrically conductive layer structure and the second electrically conductive layer structure on the one hand and sidewalls of the electrically insulating layer structure delimiting the through hole on the other hand;
forming an annular plating layer by plating to cover the sidewalls and to fill at least part of the overhang so that a horizontal extension of the overhang after plating is less than 14 µm so that a ratio between a horizontal extension of the overhang after plating and one of a width of a first window extending through the first electrically conductive layer structure and a width of a second window extending through the second electrically conductive layer structure is smaller than 14%; wherein the horizontal extension of the overhang in the absence of plating layer is more than 20 µm.

19. The method according to claim 18, further comprising:
forming a further plating structure in a further plating procedure following the plating for forming the annular plating layer, wherein the further plating structure is formed with a substantially horizontal bridge structure connecting the sidewalls and covers the plating layer up to the first electrically conductive layer structure and up to the second electrically conductive layer structure.

20. The method according to claim 18, wherein the plating for forming the plating layer is carried out so that a thickness of the plating layer at the overhang is larger than a thickness of the plating layer in a central portion of the through hole.

21. The method according to claim 18, wherein the plating for forming the plating layer is carried out with a reverse current operation.

22. The method according to claim 18, further comprising:
forming an electrically conductive seed layer by electroless deposition between the sidewalls and the plating layer.

23. The method according to claim 18, wherein forming the through hole comprises a first laser drilling from the front side by one laser shot and a second laser drilling from the back side by only one laser shot.

24. The method according to claim 18, wherein forming the through hole comprises a first laser drilling from the front side by one laser shot and a second laser drilling from the back side by two laser shots.

25. The method according to claim 19, wherein the method comprises forming the plating layer and forming the bridge structure in separate subsequent procedures.

* * * * *